United States Patent
Wen et al.

(10) Patent No.: US 12,408,506 B2
(45) Date of Patent: Sep. 2, 2025

(54) ORGANIC LIGHT EMITTING DEVICE AND DISPLAY APPARATUS

(71) Applicant: BOE Technology Group Co., Ltd., Beijing (CN)

(72) Inventors: Guanyin Wen, Beijing (CN); Yansong Li, Beijing (CN); Xiaobo Du, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 869 days.

(21) Appl. No.: 17/608,749

(22) PCT Filed: Jan. 22, 2021

(86) PCT No.: PCT/CN2021/073306
§ 371 (c)(1),
(2) Date: Nov. 3, 2021

(87) PCT Pub. No.: WO2022/155893
PCT Pub. Date: Jul. 28, 2022

(65) Prior Publication Data
US 2023/0255045 A1   Aug. 10, 2023

(51) Int. Cl.
*H10K 50/11*   (2023.01)
*H10K 50/12*   (2023.01)
(Continued)

(52) U.S. Cl.
CPC ........... *H10K 50/13* (2023.02); *H10K 50/121* (2023.02); *H10K 50/181* (2023.02); *H10K 59/12* (2023.02);
(Continued)

(58) Field of Classification Search
CPC .... H10K 50/121; H10K 50/13; H10K 50/181; H10K 2101/10; H10K 2101/40;
(Continued)

(56) References Cited

U.S. PATENT DOCUMENTS 9,882,144 B2 * 1/2018 Kawamura .......... H10K 85/654
2009/0146560 A1 * 6/2009 Kim ....................... H10K 50/14
313/506

(Continued)

FOREIGN PATENT DOCUMENTS

CN    102496682 B    11/2015
CN    108987594 A    12/2018
(Continued)

OTHER PUBLICATIONS

Mehes et al. ((2020). Physics and Design Principles of OLED Devices. In: Adachi, C., Hattori, R., Kaji, H., Tsujimura, T. (eds) Handbook of Organic Light-Emitting Diodes. Springer, Tokyo. https://doi.org/10.1007/978-4-431-55761-6_49-1 (Year: 2020).*

(Continued)

*Primary Examiner* — Jarrett J Stark
(74) *Attorney, Agent, or Firm* — Ling Wu; Stephen Yang; Ling and Yang Intellectual Property

(57) ABSTRACT

Provided is an organic light emitting device, including a first electrode, second electrode, and first and second emitting layers that are disposed between first and second electrodes. The first emitting layer is located on a side of the second emitting layer close to the first electrode. The first emitting layer includes a first host material and first dopant material. The second emitting layer includes a second host material different from the first host material, and second dopant material. An electron block layer disposed between first emitting layer and first electrode, first emitting layer and second emitting layer satisfy:

$|HOMO_{EBL}| < |HOMO_{EML1}| < |HOMO_{EML2}|$, $|HOMO_{EML1} - HOMO_{EBL}| = 0.2$ eV to 0.4 eV, where $HOMO_{EBL}$ is a HOMO energy level of the electron block layer, $HOMO_{EML1}$ is a HOMO energy level of (Continued)

the first emitting layer, $HOMO_{EML2}$ is a HOMO energy level of the second emitting layer.

16 Claims, 6 Drawing Sheets

(51) Int. Cl.
  *H10K 50/13* (2023.01)
  *H10K 50/18* (2023.01)
  *H10K 59/12* (2023.01)
  *H10K 101/10* (2023.01)
  *H10K 101/40* (2023.01)
  *H10K 102/00* (2023.01)

(52) U.S. Cl.
  CPC ..... *H10K 2101/10* (2023.02); *H10K 2101/40* (2023.02); *H10K 2102/351* (2023.02)

(58) Field of Classification Search
  CPC ............. H10K 2102/351; H10K 59/12; H10K 85/631; H10K 50/11
  See application file for complete search history.

(56) References Cited

U.S. PATENT DOCUMENTS

| | | | | |
|---|---|---|---|---|
| 2016/0197286 | A1* | 7/2016 | Kawamura | H05B 33/14 257/40 |
| 2017/0222171 | A1* | 8/2017 | Hamada | H10K 59/876 |
| 2018/0149595 | A1 | 5/2018 | Adachi et al. | |
| 2018/0240994 | A1* | 8/2018 | Pentlehner | H10K 50/19 |
| 2019/0288212 | A1* | 9/2019 | Cho | H10K 85/658 |

FOREIGN PATENT DOCUMENTS

| | | |
|---|---|---|
| CN | 109148710 A | 1/2019 |
| CN | 110098340 A | 8/2019 |
| CN | 110265560 A | 9/2019 |
| CN | 111092161 A | 5/2020 |
| CN | 111092163 A | 5/2020 |
| CN | 108987594 B | 6/2020 |
| CN | 111653679 A | 9/2020 |
| CN | 111785744 A | 10/2020 |
| CN | 111883680 A | 11/2020 |
| JP | 2018092993 A | 6/2018 |

OTHER PUBLICATIONS

Dicheng Zhou et al., High Efficiency Green Organic Light-Emitting Diode Based on Double Light-Emitting Layers Structure, Laser & Optoelectronics Progress, Aug. 2020, vol. 57, No. 15.

H.S. Bang et al., Efficiency Stabilization in Blue Organic Light-Emitting Devices Fabricated Utilizing a Double Emitting Layer with Fluorescence and Phosphorescence Doped Layers, Mol. Cryst. Liq. Cryst., 2009, vol. 498, pp. 265-273.

* cited by examiner

ORGANIC LIGHT EMITTING DEVICE AND DISPLAY APPARATUS

CROSS-REFERENCE TO RELATED APPLICATION

The present application is a U.S. National Phase Entry of International Application No. PCT/CN2021/073306 having an international filing date of Jan. 22, 2021, the content of which is hereby incorporated by reference.

TECHNICAL FIELD

The present disclosure relates to, but is not limited to the field of display technology, in particular to an organic light emitting device and a display apparatus.

BACKGROUND

As a new type of flat panel display devices, Organic Light Emitting Devices (OLEDs) have attracted more and more attention. An OLED is an active light emitting device, which has the advantages of high brightness, color saturation, ultra-thinness, wide angle of view, low power consumption, extremely high response speed, and flexibility.

The OLED includes an anode, a cathode, and an emitting layer disposed between the anode and the cathode. The light emitting principle of the OLED is that holes and electrons are injected into the emitting layer from the anode and the cathode respectively, when the electrons and the holes meet in the emitting layer, the electrons and the holes are recombined to produce excitons, and when transitioning from an excited state to a ground state, these excitons emit light.

SUMMARY

The following is a brief description of the subject matter described in detail in the present disclosure. This brief description is not intended to limit the scope of protection of the claims.

Embodiments of the present disclosure provide an organic light emitting device and a display apparatus.

In one aspect, an embodiment of the present disclosure provides An organic light emitting device, including: a first electrode, a second electrode, and a first emitting layer and a second emitting layer that are disposed between the first electrode and the second electrode, wherein the first emitting layer is located on a side of the second emitting layer close to the first electrode; and an electron block layer is disposed between the first emitting layer and the first electrode; the first emitting layer includes a first host material and a first dopant material, the second emitting layer includes a second host material and a second dopant material, and the first host material is different from the second host material; the electron block layer, the first emitting layer and the second emitting layer satisfy:

$|HOMO_{EBL}| < |HOMO_{EML1}| < |HOMO_{EML2}|$, $|HOMO_{EML1} - HOMO_{EBL}| = 0.2$ eV to $0.4$ eV, where $HOMO_{EBL}$ is a Highest Occupied Molecular Orbit HOMO energy level of the electron block layer, $HOMO_{EML1}$ is a HOMO energy level of the first emitting layer, and $HOMO_{EML2}$ is a HOMO energy level of the second emitting layer;

or, the electron block layer, the first emitting layer and the second emitting layer satisfy:

$T1_{EBL} > T1_{H1} > T1_{H2}$, $T1_{D1} > T1_{H1}$, $T1_{D2} > T1_{H1}$, where $T1_{EBL}$ is a lowest triplet energy level of the electron block layer, $T1_{H1}$ is a lowest triplet energy level of the first host material of the first emitting layer, $T1_{H2}$ is a lowest triplet energy level of the second host material of the second emitting layer, and $T1_{D1}$ is a lowest triplet energy level of the first dopant material of the first emitting layer, and $T1_{D2}$ is a lowest triplet energy level of the second dopant material of the second emitting layer.

In some exemplary embodiments, a hole mobility of the first emitting layer is greater than an electron mobility of the first emitting layer, and an electron mobility of the second emitting layer is greater than a hole mobility of the second emitting layer.

In some exemplary embodiments, the HOMO energy level of the electron block layer is about $-5.4$ eV to $-5.6$ eV, the HOMO energy level of the first emitting layer is about $-5.6$ eV to $-5.8$ eV, and the HOMO energy level of the second emitting layer is about $-5.8$ eV to $-6.0$ eV.

In some exemplary embodiments, a ratio of a thickness of the first emitting layer to that of the second emitting layer is about 0.1 to 0.6.

In some exemplary embodiments, the thickness of the first emitting layer is about 3 nm to 8 nm, and the thickness of the second emitting layer is about 15 nm to 20 nm.

In some exemplary embodiments, the electron block layer, the first emitting layer and the second emitting layer further satisfy:

$|T1_{EBL} - T1_{H1}| \geq 0.1$ eV, $|T1_{D1} - T1_{H1}| \geq 0.1$ eV, $|T1_{D2} - T1_{H1}| \geq 0.1$ eV, $|T1_{H1} - T1_{H2}| \geq 0.3$ eV, In some exemplary embodiments, the electron block layer, the first emitting layer and the second emitting layer further satisfy:

$|HOMO_{EBL} - HOMO_{H1}| < 0.2$ eV, $|HOMO_{H1} - HOMO_{H2}| < 0.2$ eV, where $HOMO_{H1}$ is a HOMO energy level of the first host material of the first emitting layer, and $HOMO_{H2}$ is a HOMO energy level of the second host material of the second emitting layer.

In some exemplary embodiments, the first host material is a hole-rich material, and the second host material is an electron-rich material.

In some exemplary embodiments, a hole mobility of the first host material is greater than 100 times of an electron mobility of the first host material, and an electron mobility of the second host material is greater than 100 times of a hole mobility of the second host material.

In some exemplary embodiments, a thickness of the first emitting layer is about 0.1 nm to 10 nm.

In some exemplary embodiments, a doping ratio of the first dopant material in the first emitting layer is the same as that of the second dopant material in the second emitting layer.

In some exemplary embodiments, a doping ratio of the first dopant material in the first emitting layer is about 0.1% to 30%, and a doping ratio of the second dopant material in the second emitting layer is about 0.1% to 30%.

In some exemplary embodiments, both the first emitting layer and the second emitting layer are blue emitting layers.

In some exemplary embodiments, materials of the first emitting layer and the second emitting layer respectively include at least one of the following: pyrene derivatives, anthracene derivatives, fluorene derivatives, perylene derivatives, styrylamine derivatives and metal complexes.

In some exemplary embodiments, a material of the electron block layer includes a triphenylamine organic material.

In another aspect, an embodiment of the present disclosure provides a display apparatus, including the organic light emitting device described above.

After reading and understanding the drawings and the detailed description, other aspects may be understood.

BRIEF DESCRIPTION OF DRAWINGS

The drawings are used to provide a further understanding of the technical solution of the present disclosure, constitute a part of the description, are used together with the embodiments of the present disclosure to explain the technical solution of the present disclosure, and do not constitute limitations to the technical solution of the present disclosure. The shape and size of at least one component in the drawings do not reflect the actual scale, and the purpose is only to schematically illustrate the contents of the present disclosure.

DETAILED DESCRIPTION

Figure 1:
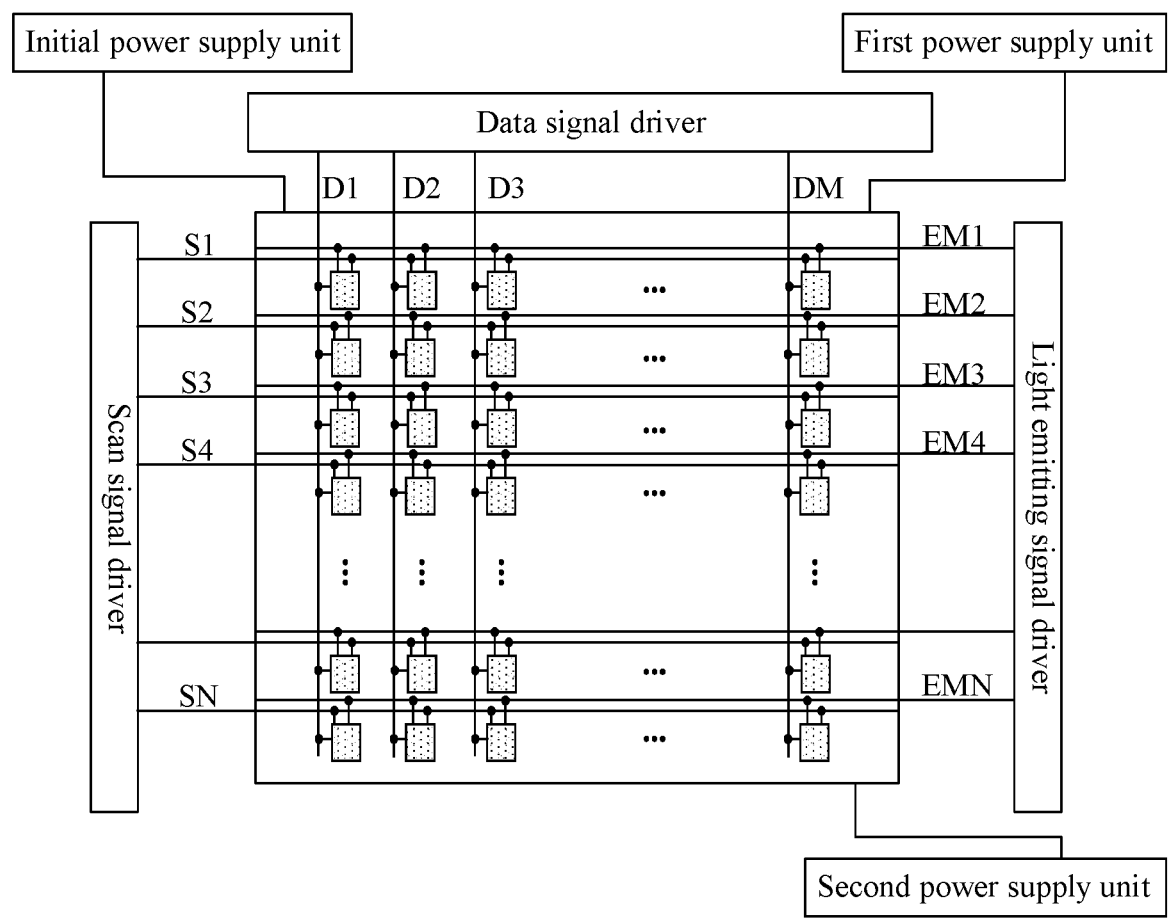
FIG. 1 illustrates a schematic diagram of a structure of a display apparatus.

The embodiments herein may be implemented in a plurality of different forms. Those skilled in the art can easily understand the fact that the implementations and contents may be transformed into various forms without departing from the essence and scope of the present disclosure. Therefore, the present disclosure should not be interpreted as limited to the content recorded in the following embodiments. Without conflict, the embodiments in the present disclosure and the features in the embodiments may be freely combined with each other.

In the drawings, sometimes the size of the constituent elements, the thickness or region of the layer may be exaggerated for the sake of clarity. Therefore, any implementation of the present disclosure is not necessarily limited to the size illustrated in the drawing, and the shape and size of the components in the drawing do not reflect the actual scale. In addition, the drawings schematically illustrate ideal examples, and any implementation of the present disclosure is not limited to the shape or value illustrated in the drawings.

The ordinal numerals such as "first", "second" and "third" herein are set up to avoid the confusion of the constituent elements, not to limit the quantity. Herein, "a plurality of" represents a number of two or more than two.

In the present disclosure, for the sake of convenience, "middle", "up", "down", "front", "back", "vertical", "horizontal", "top", "bottom", "inside", "outside" and other words indicating an orientation or positional relationship are used to describe the positional relationship between constituent elements with reference to the drawings, only for the convenience of describing the embodiments and simplifying the description, rather than indicating or implying that the device or element must have a specific orientation or be constructed and operated in a specific orientation, so they should not be understood as limitations to the present disclosure. The positional relationship between the constituent elements may be appropriately changed according to the direction of the described constituent elements. Therefore, it is not limited to the words and sentences described herein, and can be changed appropriately according to the situation.

In the present disclosure, unless otherwise specified and limited, the terms "mount", "connected" and "connect" shall be understood in a broad sense. For example, it may be fixed connection, removable connection, or integrated connection; it may be mechanical connection or electrical connection; it may be direct connection, indirect connection through an intermediate component, or communication inside two components. For those skilled in the art, the meanings of the above terms in the present disclosure may be understood according to the situation.

In the present disclosure, a transistor refers to an element which includes at least three terminals, i.e., a gate electrode, a drain electrode and a source electrode. A transistor has a channel region between the drain electrode (or drain electrode terminal, drain region or drain) and the source electrode (or source electrode terminal, source region or source), and the current can flow through the drain electrode, the channel region and the source electrode. Herein, the channel region refers to the region where the current mainly flows.

In the present disclosure, a first electrode may be a drain electrode and a second electrode may be a source electrode, or a first electrode may be a source electrode and a second electrode may be a drain electrode. The functions of "source electrode" and "drain electrode" may sometimes be exchanged when transistors of opposite polarity are used or when the current direction changes during circuit operation. Therefore, in the present disclosure "source electrode" and "drain electrode" may be exchanged with each other.

In the present disclosure, "electrical connection" includes the case where constituent elements are connected together by a component having a certain electrical action. As long as electrical signals between the connected constituent elements can be sent and received by "component having a certain electrical action", there is no special limitation thereto. "Component having a certain electrical action", for example, may be an electrode or wiring, or a switching element such as a transistor, or other functional element such as a resistor, an inductor or a capacitor.

In the present disclosure, "parallel" refers to a state in which an angle formed by two straight lines is more than −10° and less than 10°. Therefore, it also includes a state in which an angle is more than −5° and less than 5°. In addition, "vertical" refers to a state in which an angle formed by two straight lines is more than 80° and less than 100°. Therefore, it also includes a state in which an angle is more than 85° and less than 95°.

In the present disclosure, "film" and "layer" may be exchanged. For example, sometimes "conducting layer" may be replaced by "conducting film". Similarly, sometimes "insulating film" may be replaced by "insulating layer".

In the present disclosure, "about" refers to a numerical value within a range of allowable process and measurement errors without strictly limiting the limit.

FIG. 1 illustrates a schematic diagram of a structure of a display apparatus. Referring to FIG. 1, the display apparatus may include a scan signal driver, a data signal driver, a light emitting signal driver, a display substrate, a first power supply unit, a second power supply unit and an initial power supply unit. In some exemplary embodiments, the display substrate at least includes a plurality of scan signal lines (S1 to SN), a plurality of data signal lines (D1 to DM) and a plurality of light emitting signal lines (EM1 to EMN). The scan signal driver is configured to sequentially provide scan signals to the plurality of scan signal lines (S1 to SN), the data signal driver is configured to provide data signals to the plurality of data signal lines (D1 to DM), and the light emitting signal driver is configured to sequentially provide light emitting control signals to the plurality of light emitting signal lines (EM1 to EMN). In some exemplary embodiments, the plurality of scan signal lines and the plurality of light emitting signal lines extend along a horizontal direction, and a plurality of data signal lines extend in a vertical direction. The display substrate includes a plurality of sub-pixels. Each sub-pixel includes a pixel drive circuit and a light emitting device. The pixel drive circuit is connected with the scan signal line, the light emitting control line and the data signal line, and is configured to receive a data voltage transmitted by the data signal line and output a corresponding current to the light emitting device under the control of the scan signal line and the light emitting signal line. The light emitting device is connected with the pixel drive circuit, and is configured to emit light of corresponding brightness in response to the current output by the pixel drive circuit. The first power supply unit, the second power supply unit and the initial power supply unit are respectively configured to provide a first power supply voltage, a second power supply voltage and an initial power supply voltage to the pixel drive circuit through the first power supply line, the second power supply line and the initial signal line.

Figure 2:
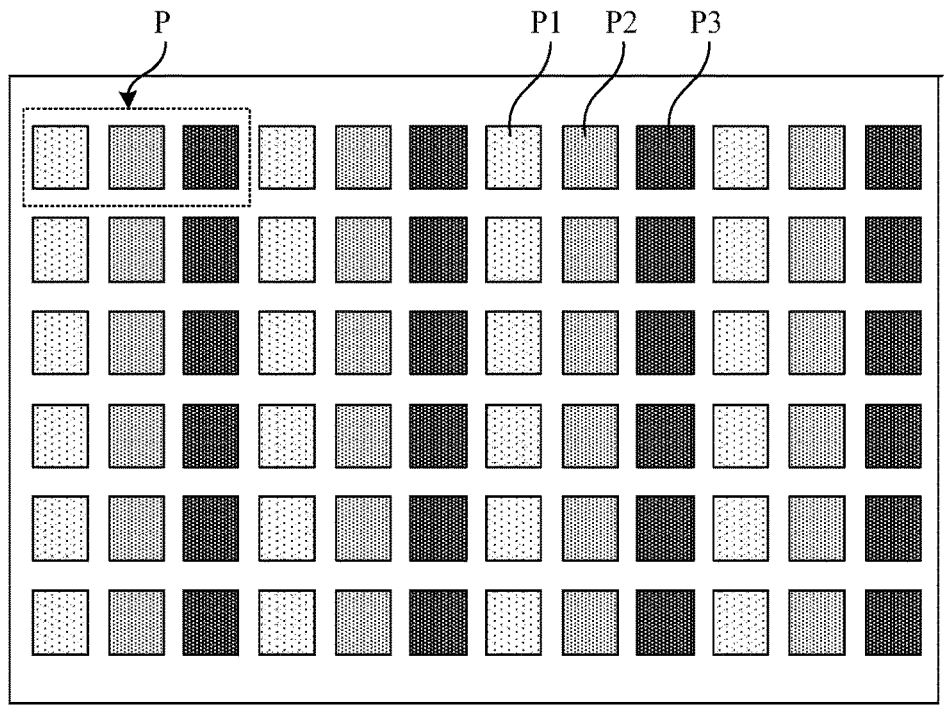
FIG. 2 illustrates a schematic diagram of a planar structure of a display substrate.

FIG. 2 illustrates a schematic diagram of a planar structure of a display substrate. Referring to FIG. 2, a display region may include a plurality of pixel units P arranged in an array. At least one of the plurality of pixel units P includes a first sub-pixel P1 emitting first-color light, a second sub-pixel P2 emitting second-color light, and a third sub-pixel P3 emitting third-color light. The first sub-pixel P1, the second sub-pixel P2 and the third sub-pixel P3 each include a pixel drive circuit and a light emitting device. In some exemplary embodiments, the pixel unit P may include a red (R) sub-pixel, a green (G) sub-pixel, and a blue (B) sub-pixel, or may include a red sub-pixel, a green sub-pixel, a blue sub-pixel, and a white (W) sub-pixel, which is not limited in the present disclosure. In some exemplary embodiments, the shape of the sub-pixels in the pixel unit may be a rectangular shape, a diamond, a pentagonal shape, or a hexagonal shape. When the pixel unit includes three sub-pixels, the three sub-pixels may be arranged in parallel horizontally, in parallel vertically or in a triangle shape. When the pixel unit includes four sub-pixels, the four sub-pixels may be arranged in parallel horizontally, in parallel vertically or in a square shape. However, the present disclosure is not limited thereto.

Figure 3:
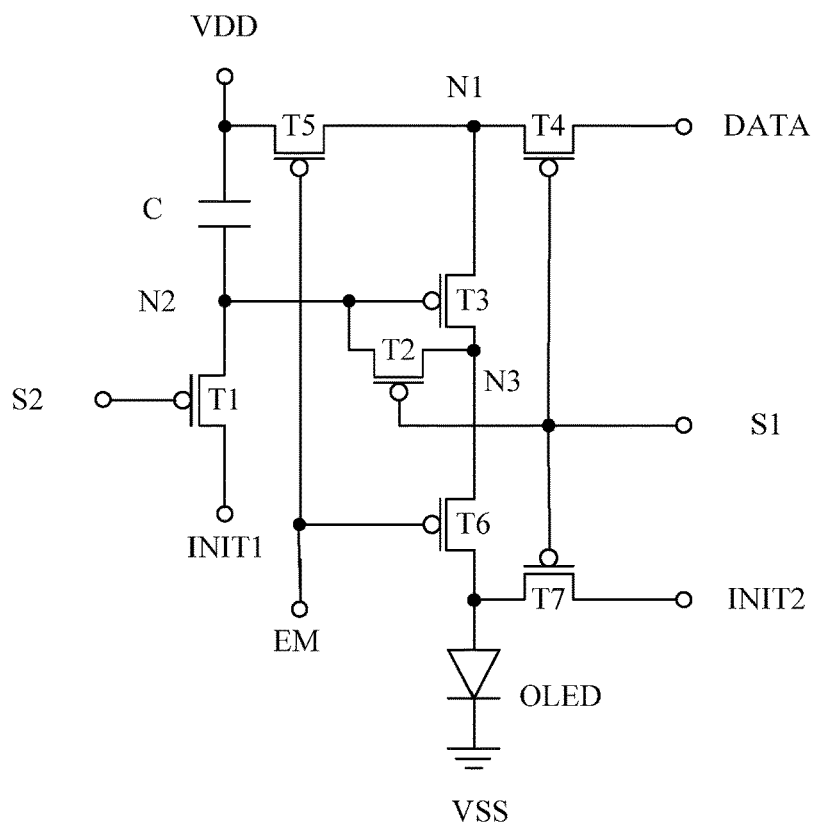
FIG. 3 illustrates an equivalent circuit diagram of a pixel drive circuit.

In some exemplary embodiments, the pixel drive circuit may be a 3T1C, 4T1C, 5T1C, 5T2C, 6T1C, or 7T1C structure. FIG. 3 illustrates an equivalent circuit diagram of a pixel drive circuit. Referring to FIG. 3, the pixel drive circuit may include seven switching transistors (first transistor T1 to seventh transistor T7), one storage capacitor C and eight signal lines (data signal line DATA, first scan signal line S1, second scan signal line S2, first initial signal line INIT1, second initial signal line INIT2, first power supply line VSS, second power supply line VDD and light emitting signal line EM). The first initial signal line INIT1 and the second initial signal line INIT2 may be the same signal line.

In some exemplary embodiments, a control electrode of the first transistor T1 is connected with the second scan signal line S2, a first electrode of the first transistor T1 is connected with the first initial signal line INIT1, and a second electrode of the first transistor T1 is connected with a second node N2. A control electrode of the second transistor T2 is connected with the first scan signal line S1, a first electrode of the second transistor T2 is connected with the second node N2, and a second electrode of the second transistor T2 is connected with a third node N3. A control electrode of the third transistor T3 is connected with the second node N2, a first electrode of the third transistor T3 is connected with the first node N1, and a second electrode of the third transistor T3 is connected with the third node N3. A control electrode of the fourth transistor T4 is connected with the first scan signal line S1, a first electrode of the fourth transistor T4 is connected with the data signal line DATA, and a second electrode of the fourth transistor T4 is connected with the first node N1. A control electrode of the fifth transistor T5 is connected with the light emitting signal line EM, a first electrode of the fifth transistor T5 is connected with the second power supply line VDD, and a second electrode of the fifth transistor T5 is connected with the first node N1. A control electrode of the sixth transistor T6 is connected with the light emitting signal line EM, a first electrode of the sixth transistor T6 is connected with the third node N3, and a second electrode of the sixth transistor T6 is connected with the first electrode of the light emitting device. A control electrode of the seventh transistor T7 is connected with the first scan signal line S1, a first electrode of the seventh transistor T7 is connected with the second initial signal line INIT2, and a second electrode of the seventh transistor T7 is connected with the first electrode of the light emitting device. A first terminal of the storage capacitor C is connected with the second power supply line VDD, and a second terminal of the storage capacitor C is connected with the second node N2.

In some exemplary embodiments, the first transistor T1 to the seventh transistor T7 may be P-type transistors or may be N-type transistors. Using the same type of transistors in the pixel drive circuit can simplify the process flow, reduce the process difficulty of the display panel, and improve the yield of the product. In some possible embodiments, the first transistor T1 to the seventh transistor T7 may include P-type transistors and N-type transistors.

In some exemplary embodiments, the second electrode of the light emitting device is connected with the first power supply line VSS. The signal of the first power supply line VSS is a low-level signal and the signal of the second power supply line VDD is a continuously provided high-level signal. The first scan signal line S1 is a scan signal line in the pixel drive circuit of a current display row, and the second scan signal line S2 is a scan signal line in the pixel drive circuit of a previous display row, that is, for the nth display row, the first scan signal line S1 is S(n) and the second scan signal line S2 is S(n−1). The second scan signal line S2 of the current display row and the first scan signal line S1 of the pixel drive circuit of the previous display row are the same signal line, thus reducing the number of the signal lines of the display panel and realizing the narrow frame of the display panel.

Figure 4:
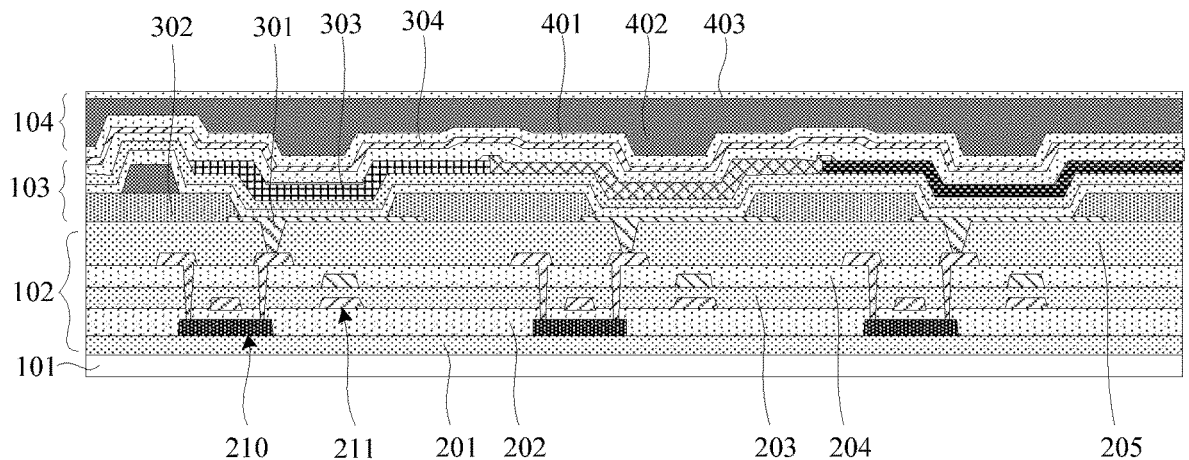
FIG. 4 illustrates a schematic diagram of a sectional structure of a display substrate.

FIG. 4 is a schematic diagram of a sectional structure of a display substrate, and illustrates a structure of three sub-pixels of the display substrate. Referring to FIG. 4, on a plane perpendicular to the display substrate, the display substrate may include a drive circuit layer 102 disposed on a base substrate 101, a light emitting device 103 disposed on a side of the drive circuit layer 102 far away from the base substrate 101, and an encapsulation layer 104 disposed on the side of the light emitting device 103 far away from the base substrate 101. In some possible embodiments, the display substrate may include other film layers, such as post spacers, which is not limited in the present disclosure.

In some exemplary embodiments, the base substrate 101 may be a flexible base substrate or may be a rigid base substrate. The flexible base substrate may include a first flexible material layer, a first inorganic material layer, a semiconductor layer, a second flexible material layer and a second inorganic material layer stacked. The materials of the first flexible material layer and the second flexible material layer may be polyimide (PI), polyethylene terephthalate (PET) or polymer soft film after surface treatment. The materials of the first inorganic material layer and the second inorganic material layer may be silicon nitride (SiNx) or silicon oxide (SiOx), so as to improve the water oxygen resistance of the base substrate. The material of the semiconductor layer may be amorphous silicon (a-si).

In some exemplary embodiments, the drive circuit layer 102 of each sub-pixel may include a plurality of transistors and a storage capacitor forming the pixel drive circuit. In FIG. 4, illustration is given by taking each sub-pixel including a drive transistor and a storage capacitor as an example. In some possible embodiments, the drive circuit layer 102 of each sub-pixel may include a first insulating layer 201 disposed on the base substrate; an active layer disposed on the first insulating layer; a second insulating layer 202 covering the active layer; a gate electrode and a first capacitor electrode disposed on the second insulating layer 202; a third insulating layer 203 covering the gate electrode and the first capacitor electrode; a second capacitor electrode disposed on the third insulating layer 203; a fourth insulating layer 204 covering the second capacitor electrode, the second insulating layer 202, the third insulating layer 203 and the fourth insulating layer 204 being provided with vias exposing the active layer; a source electrode and a drain electrode disposed on the fourth insulating layer 204, the source electrode and the drain electrode being respectively connected with the active layer through vias; a planarization layer 205 covering the structure and provided with vias exposing the drain electrode. The active layer, the gate electrode, the source electrode and the drain electrode form a drive transistor 210. The first capacitor electrode and the second capacitor electrode form a storage capacitor 211.

In some exemplary embodiments, the light emitting device 103 may include an anode 301, a pixel definition layer 302, an organic emitting layer 303, and a cathode 304. The anode 301 is disposed on the planarization layer 205, and is connected with the drain electrode of the drive transistor 210 through a via provided in the planarization layer 205. The pixel definition layer 302 is disposed on the anode 301 and the planarization layer 205 and is provided with a pixel opening exposing the anode 301. The organic emitting layer 303 is at least partially disposed in the pixel opening, and is connected with the anode 301. The cathode 304 is disposed on the organic emitting layer 303 and is connected with the organic emitting layer 303. The organic emitting layer 303 emits light of corresponding colors under the drive of the anode 301 and the cathode 304.

In some exemplary embodiments, the encapsulation layer 104 may include a first encapsulation layer 401, a second encapsulation layer 402 and a third encapsulation layer 403 which are stacked. The first encapsulation layer 401 and the third encapsulation layer 403 may be made of an inorganic material, the second encapsulation layer 402 may be made of an organic material, and the second encapsulation layer 402 is disposed between the first encapsulation layer 401 and the third encapsulation layer 403 to ensure that external water vapor cannot enter the light emitting device 103.

In some exemplary embodiments, the organic emitting layer of the light emitting device may include one or more of an Emitting Layer (EML), a Hole Injection Layer (HIL), a Hole Transport Layer (HTL), a Hole Block Layer (HBL), an Electron Block Layer (EBL), an Electron Injection Layer (EIL), and an Electron Transport Layer (ETL). Under the drive of the voltage of the anode and the cathode, light is emitted according to the required gray scale by using the light emitting property of the organic material.

In some exemplary embodiments, the emitting layers of OLED light emitting devices of different colors are different. For example, a red light emitting device includes a red emitting layer, a green light emitting device includes a green emitting layer, and a blue light emitting device includes a blue emitting layer. In order to reduce the difficulty of the process and improve the yield, the hole injection layer and hole transport layer on one side of the emitting layer may adopt a common connected layer, and the electron injection layer and the electron transport layer on the other side of the emitting layer may adopt a common connected layer. In some exemplary embodiments, any one or more of the hole injection layer, hole transport layer, electron injection layer and electron transport layer may be made through a one process (one evaporation process or one inkjet printing process), which, however, are isolated by the formed film layer surface segment difference or by means of surface treatment. For example, any one or more of the hole injection layers, hole transport layers, electron injection layers and electron transport layers corresponding to adjacent sub-pixels may be isolated. In some exemplary embodiments, the organic emitting layer may be formed by adopting Fine Metal Mask (FMM) or open mask evaporation or by adopting an inkjet process.

With the continuous development of products, the market requires higher resolution of products, higher brightness of independent sub-pixels and lower power consumption of products. Therefore, higher requirements are attached to the efficiency, brightness, voltage and service life of the device.

Figure 5:
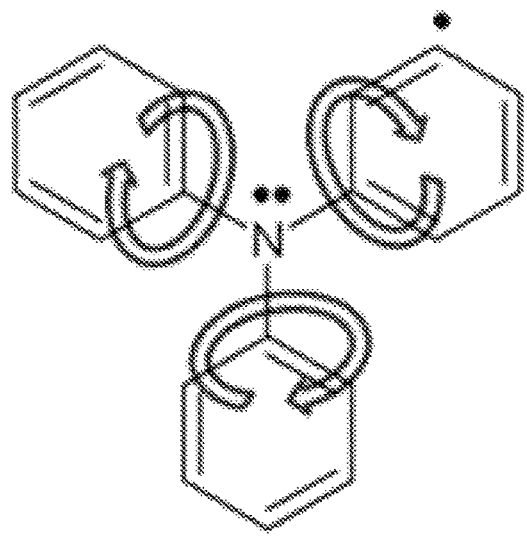
FIG. 5 illustrates a schematic diagram of bond twisting of an electron block layer.

Research results show that the service life decay of single-color OLEDs or single-color light emitting elements in OLEDs is mainly caused by interface degradation and material defects. The main reason for interface deterioration is that the energy barrier at the interface is too large and the accumulated charges are too many. For example, the interfaces on the two sides of the emitting layer are the key interfaces for hole and electron injected into the emitting layer. The energy level matching of the two interfaces is easy to cause carrier accumulation. This charge accumulation is easy to lead to interface degradation and accelerate the service life decay of the device. The main reason for material defects is the distortion of the bond or the fracture of the bond. For example, the more easily deteriorated material in OLED is the material of the electron block layer. FIG. 5 illustrates a schematic diagram of bond twisting of an electron block layer. Usually, the material of the electron block layer itself is the material of the electron-rich system and contains the structure of phenylamine. For example, the material of the electron block layer is a triphenylamine organic small-molecular material. Too many accumulated electrons will produce a repulsive force with the rich electrons of the electron block layer itself, which will cause benzene ring 6 bond distortion on phenylamine. The result of 6 bond distortion caused by external force is bond fracture, resulting in material defects and rapid service life decay of device, referring to FIG. 5.

Figure 6:
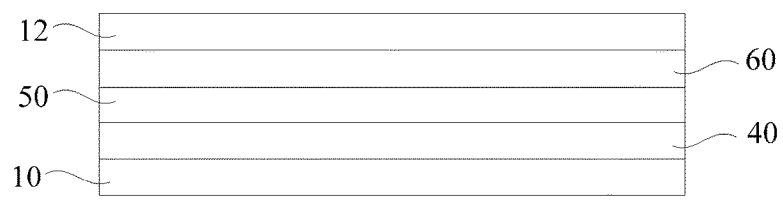
FIG. 6 illustrates a schematic diagram of a structure of an OLED according to at least one embodiment of the present disclosure.

FIG. 6 illustrates a schematic diagram of a structure of an OLED according to at least one embodiment of the present disclosure. Referring to FIG. 6, the OLED provided by this exemplary embodiment includes a first electrode 10, a second electrode 12 and an organic emitting layer disposed between the first electrode 10 and the second electrode 12. In some exemplary embodiments, the first electrode 10 is an anode and the second electrode 12 is a cathode. The organic emitting layer includes an electron block layer 40, a first emitting layer 50 and a second emitting layer 60 which are stacked. The first emitting layer 50 is located on the side of the second emitting layer 60 close to the first electrode 10. The electron block layer 40 is disposed between the first emitting layer 50 and the first electrode 10. In some exemplary embodiments, the electron block layer 40 is configured to form a migration barrier for electrons to prevent electrons from migrating out of the first emitting layer 50. The first emitting layer 50 and the second emitting layer 60 are configured to make electrons and holes recombined to emit light.

In some exemplary embodiments, the first emitting layer 50 includes a first host material and a first dopant material. The second emitting layer 60 includes a second host material and a second dopant material. The first host material is different from the second host material. In some examples, the first dopant material is the same as the second dopant material. However, the present embodiment is not limited thereto. For example, the first dopant material and the second dopant material may be different.

In some exemplary embodiments, the doping ratio of the first dopant material in the first emitting layer may be the same as the doping ratio of the second dopant material in the second emitting layer. However, the present embodiment is not limited thereto. For example, the doping ratio of the first dopant material in the first emitting layer may be different from the doping ratio of the second dopant material in the second emitting layer.

In some exemplary embodiments, the doping ratio of the first dopant material in the first emitting layer is about 0.1% to 30%, and the doping ratio of the second dopant material in the second emitting layer is about 0.1% to 30%. The doping ratio refers to a ratio of the mass of the dopant material to the mass of the emitting layer, that is, the mass percentage. Within the doping ratio range, on the one hand, the host material in the emitting layer can effectively transfer the exciton energy to the dopant material in the emitting layer to excite the emitting layer to emit light; on the other hand, the host material in the emitting layer "dilutes" the dopant material in the emitting layer, which effectively improves the fluorescence quenching caused by the collision between molecules and energy of the dopant material in the emitting layer, The luminous efficiency and device life are improved.

In some exemplary embodiments, in the first emitting layer the hole mobility is greater than the electron mobility, and in the second emitting layer the electron mobility is greater than the hole mobility. In some examples, the first host material in the first emitting layer is a hole-rich material, such as fluorene derivative, and the hole mobility of the first host material is greater than the electron mobility thereof. The second host material in the second emitting layer is an electron-rich material, and the electron mobility of the second host material is greater than the hole mobility thereof. In this exemplary embodiment, by setting the mobilities of the first emitting layer and the second emitting layer, the charge accumulation at the interface between the first emitting layer and the electron block layer can be reduced, a exciton recombination region can move towards the interface between the first emitting layer and the second emitting layer, the exciton recombination region is far away from the electron block layer, the damage to the electron block layer can be reduced, the material deterioration and performance degradation caused by electron accumulation are reduced, the service life of the organic light emitting device is improved, and the luminous efficiency is improved.

In some exemplary embodiments, the electron block layer, the first emitting layer and the second emitting layer satisfy:

$$|HOMO_{EBL}|<|HOMO_{EML1}|<|HOMO_{EML2}|,$$

$$|HOMO_{EML1}-HOMO_{EBL}|=0.2 \text{ eV to } 0.4 \text{ eV},$$

where $HOMO_{EBL}$ is the Highest Occupied Molecular Orbit (HOMO) energy level of the electron block layer, $HOMO_{EML1}$ is the HOMO energy level of the first emitting layer, and $HOMO_{EML2}$ is the HOMO energy level of the second emitting layer.

In this exemplary embodiment, the HOMO energy level $HOMO_{EML1}$ of the first emitting layer is between the HOMO energy level $HOMO_{EBL}$ of the electron block layer and the HOMO energy level $HOMO_{EML2}$ of the second emitting layer. For example, the HOMO energy level of the first emitting layer is greater than the HOMO energy level of the electron block layer and less than the HOMO energy level of the second emitting layer. In some examples, the HOMO energy level of the electron block layer may be about −5.4 eV to −5.6 eV, the HOMO energy level of the first emitting layer may be about −5.6 eV to −5.8 eV, and the HOMO energy level of the second emitting layer may be about −5.8 eV to −6.0 eV. However, this embodiment is not limited to thereto.

In this exemplary embodiment, by setting the HOMO energy level relationship among the electron block layer, the first emitting layer and the second emitting layer, or the energy level relationship and the mobility relationship between the first emitting layer and the second emitting layer, the charge accumulation at the interface of the first emitting layer and the electron block layer can be reduced, the exciton recombination region is moved towards the interface between the first emitting layer and the second emitting layer, and the exciton recombination region is far away from the electron block layer, and the damage to the electron block layer is reduced, the material stability of the electron block layer is improved, the material deterioration and performance degradation caused by electron accumulation are reduced, the service life of the organic light emitting device is improved, and the luminous efficiency is improved. Moreover, by setting the HOMO energy level relationship between the electron block layer and the first emitting layer, the hole accumulation caused by the energy level gap can be reduced, which is conducive to the hole transport to the first emitting layer, thus reducing the on voltage of the device.

In some exemplary embodiments, the thickness of the first emitting layer is about 3 nm to 8 nm, and the thickness of the second emitting layer is about 15 nm to 20 nm. In this exemplary embodiment, by setting the HOMO energy level relationship among the electron block layer, the first emitting layer and the second emitting layer, and combining the thickness difference design of the first emitting layer and the second emitting layer, the quenching effect on excitons caused by too high hole concentration in the first emitting layer and the second emitting layer can be avoided, thus improving the luminous efficiency of the device, and improving the service life of the device.

In some exemplary embodiments, the electron block layer, the first emitting layer and the second emitting layer satisfy:

$$T1_{EBL} > T1_{H1} > T1_{H2},$$

$$T1_{D1} > T1_{H1},$$

$$T1_{D2} > T1_{H1},$$

where $T1_{EBL}$ is the lowest triplet energy level of the electron block layer, $T1_{H1}$ is the lowest triplet energy level of the first host material of the first emitting layer, $T1_{H2}$ is the lowest triplet energy level of the second host material of the second emitting layer, and $T1_{D1}$ is the lowest triplet energy level of the first dopant material of the first emitting layer, and $T1_{D2}$ is the lowest triplet energy level of the second dopant material of the second emitting layer.

In some exemplary embodiments, the electron block layer, the first emitting layer and the second emitting layer further satisfy:

$$|T1_{EBL} - T1_{H1}| \geq 0.1 \text{ eV},$$

$$|T1_{D1} - T1_{H1}| \geq 0.1 \text{ eV},$$

$$|T1_{D2} - T1_{H1}| \geq 0.1 \text{ eV},$$

$$|T1_{H1} - T1_{H2}| \geq 0.3 \text{ eV}.$$

When electrons and holes recombine to form excitons, there is a probability of 25% to form singlet excitons and a probability of 75% to form triplet excitons. The singlet excitons will return to the ground state S0 from the lowest singlet state (S1) energy level and release photons, that is, emit fluorescence, while the triplet excitons in the fluorescent material cannot return to the ground state S0 from the lowest triplet state (T1) energy level due to transition prohibition, and can only release energy through thermal radiation. Therefore, an internal quantum efficiency of the fluorescent material does not exceed 25%. It is found from researches that when two triplet excitons are coupled, there is a certain probability that they will be transformed into singlet excitons, so that the luminous efficiency can be further improved by releasing photons back to the ground state S0. This effect is called Triplet-Triplet Annihilation (TTA) effect. According to the number of spin orbits of singlet state, triplet state and quintet state, when two triplet excitons are coupled, there will be a probability of 1/9 to form singlet recombined excitons, a probability of 3/9 to form triplet recombined excitons and a probability of 5/9 to form quintet recombined excitons. Assuming that there are 180 triplet excitons to recombine, 10 singlet recombined excitons, 30 triplet recombined excitons and 50 quintet recombined excitons will be formed. 10 singlet recombined excitons will be transformed into 10 singlet excitons and 10 ground-state molecules through energy distribution, transfer and loss; 30 triplet recombined excitons will be transformed into 30 triplet excitons and 30 ground-state molecules; 50 quintet recombined excitons will be transformed into 100 triplet excitons. Therefore, 180 triplet excitons are transformed into 130 triplet excitons plus 10 singlet excitons plus 40 ground-state molecules through recombination, of which 130 triplet excitons can continue to recombine, while 10 singlet excitons can emit fluorescence by returning to the ground state. Therefore, a total of 180−130=50 triplet excitons are lost and 10 singlet excitons are formed. The maximum transformation rate from the triplet state to the singlet state through the TTA effect is 20%. As mentioned above, the probability of electrons and holes recombination to form triplet excitons is 75%. Therefore, the internal quantum efficiency of the device can be increased from 25% to 25%+15%=40% by transforming up to 75%*20%=15% singlet excitons through the TTA effect.

In this exemplary embodiment, by setting the lowest triplet energy level relationship among the electron block layer, the first emitting layer and the second emitting layer, the TTA effect occurrence region is far away from the exciton recombination region, thus avoiding the triplet quenching of a large number of triplet excitons generated when electrons and holes recombine at the interface of the first emitting layer and the electron block layer due to excessive electron accumulation, improving the internal quantum efficiency of the device, and improving the luminous efficiency and service of the device.

In some exemplary embodiments, the electron block layer, the first emitting layer and the second emitting layer further satisfy:

$$|HOMO_{EBL} - HOMO_{H1}| < 0.2 \text{ eV},$$

$$|HOMO_{H1} - HOMO_{H2}| < 0.2 \text{ eV},$$

where $HOMO_{H1}$ is the HOMO energy level of the first host material of the first emitting layer, and $HOMO_{H2}$ is the HOMO energy level of the second host material of the second emitting layer.

In this exemplary embodiment, by setting the HOMO energy level relationship among the electron block layer, the first host material and the second host material, the hole transport efficiency can be improved, thus improving the luminous efficiency of the device.

In some exemplary embodiments, the hole mobility of the first host material is greater than 100 times of the electron mobility thereof, and the electron mobility of the second host material is greater than 100 times of the hole mobility thereof. In this exemplary embodiment, by setting the mobility relationship between the first host material and the second host material, exciton recombination can occur at the interface of the first emitting layer close to the electron block layer, thus supporting the separation of the exciton recombination region from the TTA effect region, avoiding triplet exciton quenching caused by the excitons, and improving the luminous efficiency and service life of the device.

In some exemplary embodiments, the thickness of the first emitting layer is about 0.1 nm to 10 nm. The thickness of the second emitting layer is not limited in this exemplary embodiment. In this exemplary embodiment, by setting the thickness of the first emitting layer, it can ensure sufficient Dexter energy transfer between the first emitting layer and the second emitting layer.

In some exemplary embodiments, both the first emitting layer and the second emitting layer are blue emitting layers. By adopting the structure of double blue emitting layers, this exemplary embodiment can improve the luminous efficiency and service life of the blue light emitting element, and can better improve the overall performance of the organic light emitting device.

In some exemplary embodiments, both the first emitting layer and the second emitting layer are blue emitting layers. The materials of the first emitting layer and the second emitting layer each include at least one of the following: pyrene derivative, anthracene derivative, fluorene derivative, perylene derivative, styrylamine derivative and metal complexes.

In some exemplary embodiments, the material of the electron block layer includes a triphenylamine organic material. In this exemplary embodiment, for the electron block layer using a triphenylamine organic material, by setting the first emitting layer and the second emitting layer, the HOMO energy level relationship among the electron block layer, the first emitting layer and the second emitting layer, and combining the thickness difference design of the first emitting layer and the second emitting layer, the material deterioration and performance degradation caused by electron accumulation can be reduced, thus improving the service life of the organic light emitting device.

In some exemplary embodiments, the HOMO energy level and the lowest triplet energy level can be tested by a photoelectron spectrophotometer (AC3/AC2), ultraviolet (UV) spectroscopy or the like, and the electron mobility and hole mobility can be tested by adopting a Space Charge Limited Current (SCLC) method.

In some exemplary embodiments, the first host material, the second host material, the first dopant material, the second dopant material and the electron block layer may be materials that meet the above energy level relationship known to those skilled in the art, which are not limited in the present disclosure.

Figure 7:
FIG. 7 illustrates a schematic diagram of a structure of another OLED according to at least one embodiment of the present disclosure.

FIG. 7 illustrates a schematic diagram of a structure of an OLED according to at least one embodiment of the present disclosure. Referring to FIG. 7, the OLED in this exemplary embodiment includes a first electrode 10, a second electrode 12, and an organic emitting layer disposed between the first electrode 10 and the second electrode 12. In some exemplary embodiments, the first electrode 10 is an anode and the second electrode 12 is a cathode. The organic emitting layer includes a hole injection layer 20, a hole transport layer 30, an electron block layer 40, a first emitting layer 50, a second emitting layer 60, a hole block layer 70, an electron transport layer 80, and an electron injection layer 90 which are stacked. The hole injection layer 20, the hole transport layer 30 and the electron block layer 40 are disposed between the first electrode 10 and the first emitting layer 50, the hole injection layer 20 is connected with the first electrode 10, the electron block layer 40 is connected with the first emitting layer 50, and the hole transport layer 30 is disposed between the hole injection layer 20 and the electron block layer 40.

The hole block layer 70, the electron transport layer 80 and the electron injection layer 90 are disposed between the second emitting layer 60 and the second electrode 12, the hole block layer 70 is connected with the second emitting layer 60, the electron injection layer 90 is connected with the second electrode 12, and the electron transport layer 80 is disposed between the hole block layer 70 and the electron injection layer 90. In some exemplary embodiments, the hole injection layer 20 is configured to reduce the potential barrier for injecting holes from the anode so that holes can be effectively injected from the anode into the first emitting layer 50. The hole transport layer 30 is configured to achieve directional and orderly controllable migration of injected holes. The electron block layer 40 is configured to form a migration barrier for electrons to prevent electrons from migrating out of the first emitting layer 50. The first emitting layer 50 and the second emitting layer 60 are configured to enable electrons and holes to recombine to emit light. The hole block layer 70 is configured to form a migration barrier for holes to prevent holes from migrating out of the second emitting layer 60. The electron transport layer 80 is configured to achieve directional and orderly controllable migration of injected electrons. The electron injection layer 90 is configured to reduce the potential barrier for injecting electrons from the cathode so that electrons can be effectively injected from the cathode into the second emitting layer 60.

In some exemplary embodiments, the first emitting layer 50 includes a first host material and a first dopant material. The second emitting layer 60 includes a second host material and a second dopant material. The first host material is different from the second host material. The first dopant material and the second dopant material may be the same.

Figure 8:
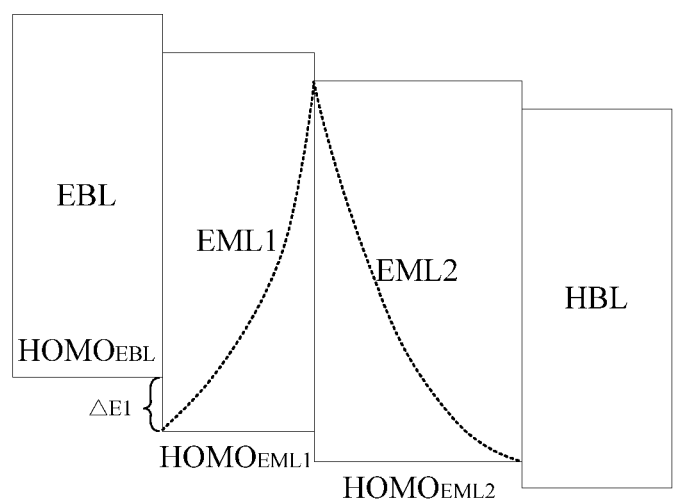
FIG. 8 illustrates a schematic diagram of an energy level relationship of an OLED according to at least one embodiment of the present disclosure.

FIG. 8 illustrates a schematic diagram of an energy level relationship of an OLED according to at least one embodiment of the present disclosure. Referring to FIG. 8, the HOMO energy level $HOMO_{EML1}$ of the first emitting layer EML1 is between the HOMO energy level $HOMO_{EBL}$ of the electron block layer EBL and the HOMO energy level $HOMO_{EML2}$ of the second emitting layer EML2. The HOMO energy level $HOMO_{EBL}$ of the electron block layer EBL is higher than the HOMO energy level $HOMO_{EML1}$ of the first emitting layer EML1, and the HOMO energy level $HOMO_{EML1}$ of the first emitting layer EML1 is higher than the HOMO energy level $HOMO_{EML2}$ of the second emitting layer EML2. The HOMO energy level $HOMO_{EML2}$ of the second emitting layer EML2 is higher than the HOMO energy level $HOMO_{HBL}$ of the hole block layer HBL. The Lowest Unoccupied Molecular Orbit (LUMO) energy level $LUMO_{EBL}$ of the electron block layer EBL is higher than the LUMO energy level $LUMO_{EML1}$ of the first emitting layer EML1, the LUMO energy level $LUMO_{EML1}$ of the first emitting layer EML1 is higher than the LUMO energy level $LUMO_{EML2}$ of the second emitting layer EML2, and the LUMO energy level $LUMO_{EML2}$ of the second emitting layer EML2 is higher than the LUMO energy level $LUMO_{HBL}$ of the hole block layer HBL.

In some exemplary embodiments, in of the first emitting layer EML1 the hole mobility is greater than the electron mobility, and in the second emitting layer EML2 the electron mobility is greater than the hole mobility. The region below the dotted line illustrated in FIG. 8 is the exciton recombination region. Since the first emitting layer has high hole mobility, the exciton recombination region can be transformed from the interface of the first emitting layer close to the electron block layer to the interface of the first emitting layer and the second emitting layer, thus greatly reducing the damage of electrons to the electron block layer and improving the service life of the device.

In some exemplary embodiments, the electron block layer, the first emitting layer, and the second emitting layer may satisfy:

$$|\text{HOMO}_{EML1} - \text{HOMO}_{EBL}| = 0.2 \text{ eV to } 0.4 \text{ eV, i.e.,}$$
$$\Delta E1 = 0.2 \text{ eV to } 0.4 \text{ eV.}$$

In this exemplary embodiment, by setting the HOMO energy level relationship between the electron block layer and the first emitting layer, the hole accumulation caused by the energy level gap can be reduced, which is conducive to the hole transport to the first emitting layer, thus reducing the on voltage of the device.

In some exemplary embodiments, the anode may be made of a material having a high work function. For a bottom emission type, the anode may be made of a transparent oxide material, such as indium tin oxide (ITO) or indium zinc oxide (IZO), and the thickness of the anode may be about 80 nm to 200 nm. For a top emission type, the anode may adopt a composite structure of metal and transparent oxide, such as Ag/ITO, Ag/IZO or ITO/Ag/ITO. The thickness of the metal layer in the anode may be about 80 nm to 100 nm, and the thickness of the transparent oxide in the anode may be about 5 nm to 20 nm, so that the average reflectivity of the anode in the visible region is about 85% to 95%.

In some exemplary embodiments, for a top emission type OLED, the cathode may be made of a metal material and formed by adopting an evaporation process, the metal material may be magnesium (Mg), silver (Ag) or aluminum (Al), or an alloy material, such as Mg:Ag alloy, the Mg:Ag ratio is about 9:1 to 1:9, and the thickness of the cathode may be about 10 nm to 20 nm, so that the average transmittance of the cathode at the wavelength of 530 nm is about 50%-60%. For a bottom emission type OLED, the cathode may be made of magnesium (Mg), silver (Ag), aluminum (Al) or Mg:Ag alloy, and the thickness of the cathode may be greater than 80 nm, so that the cathode has good reflectivity.

In some exemplary embodiments, the hole injection layer may be made of an inorganic oxide, such as molybdenum oxide, titanium oxide, vanadium oxide, rhenium oxide, ruthenium oxide, chromium oxide, zirconium oxide, hafnium oxide, tantalum oxide, silver oxide, tungsten oxide or manganese oxide, or may be made of a p-type dopant of a strong electron absorption system and a dopant of a hole transport material, such as hexacyanohexaazatriphenylene, 2,3,5,6-tetrafluoro-7,7',8,8'-tetracyano-p-quinone dimethyl (F4-TCNQ), or 1,2,3-tri[(cyano) (4-cyano-2,3,5,6-tetrafluorophenyl) methylene]cyclopropane, etc.

In some exemplary embodiments, the thickness of the hole injection layer may be about 5 nm to 20 nm.

In some exemplary embodiments, the hole transport layer may be made of an aromatic amine or carbazole material with hole transport properties, such as 4,4'-bis[N-(1-naphthyl)-N-phenylamino]biphenyl (NPB), N,N'-bis (3-methylphenyl)-N,N'-diphenyl-[1,1'-biphenyl]-4,4'-diamine (TPD), 4-phenyl-4'-(9-phenylfluorene-9-yl) triphenylamine (BAFLP), 4,4'-bis[N-(9,9-dimethylfluorene-2-yl)-n-phenylamino]biphenyl (DFLDPBI), 4,4'-bis (9-carbazole) biphenyl (CBP) or 9-phenyl-3-[4-(10-phenyl-9-anthracyl) phenyl]-9H-carbazole (PCzPA), etc.

In some exemplary embodiments, the thickness of the hole transport layer may be about 80 nm to 120 nm, and the conductivity of the hole transport layer is less than or equal to the conductivity of the hole injection layer.

In some exemplary embodiments, the electron block layer may be made of a material of an electron-rich system containing a phenylamine structure, such as a triphenylamine organic small molecular material.

In some exemplary embodiments, the first emitting layer and the second emitting layer may be made of blue light emitting materials, such as pyrene derivatives, anthracene derivatives, fluorene derivatives, perylene derivatives, styrylamine derivatives, and metal complexes. In some examples, the thickness of the first emitting layer may be about 3 nm to 8 nm, and the thickness of the second emitting layer may be about 15 nm to 20 nm.

In some exemplary embodiments, the electron transport layer and the hole block layer may be made of aromatic heterocyclic compounds, for example, imidazole derivatives such as benzimidazole derivatives, imidazolopyridine derivatives, and benzimidazolophenanthridine derivatives; azine derivatives such as pyrimidine derivatives and triazine derivatives; compounds containing a nitrogen-containing six-membered ring structure such as quinoline derivatives, isoquinoline derivatives and phenanthroline derivatives (also including compounds with a phosphine oxide substituent group on a heterocyclic ring), for example, 2-(4-biphenyl)-5-(4-tert-butylphenyl)-1,3,4-oxadiazole (PBD), 1,3-bis [5-(p-tert-butylphenyl)-1,3,4-oxadiazole-2-yl]benzene (OXD-7), 3-(4-tert-butylphenyl)-4-phenyl-5-(4-biphenyl)-1,2,4-triazole (TAZ), 3-(4-tert-butylphenyl)-4-(4-ethylphenyl)-5-(4-biphenyl)-1,2,4-triazole (p-EtTAZ), bathophenanthroline (BPhen), bathocuproine (BCP) or 4,4'-bis(5-methylbenzoxazole-2-yl) stilbene (BzOs), etc.

In some exemplary embodiments, the thickness of the hole block layer may be about 5 nm to 15 nm, and the thickness of the electron transport layer may be about 20 nm to 50 nm.

In some exemplary embodiments, the electron injection layer may be made of an alkali metals or metals, for example, materials such as lithium fluoride (LiF), ytterbium (Yb), magnesium (Mg) or calcium (Ca), or compounds of these alkali metals or metals.

In some exemplary embodiments, the thickness of the electron injection layer may be about 0.5 nm to 2 nm.

In some exemplary embodiments, the OLED may include an encapsulation layer, which may be encapsulated by using a cover plate or a thin film.

In some exemplary embodiments, for a top emission type OLED, the thickness of the organic emitting layer between the cathode and the anode may be designed according to the optical path requirement of the optical micro resonant cavity to obtain the optimal light intensity and color.

In some exemplary embodiments, a display substrate including an OLED structure may be manufactured by adopting the following manufacturing method. First, a drive circuit layer is formed on a base substrate by using a patterning process. The drive circuit layer of each sub-pixel may include a drive transistor and a storage capacitor which form the pixel drive circuit. Then, a planarization layer is formed on the base substrate on which the above structure is formed. A via exposing a drain electrode of the drive transistor is formed in the planarization layer of each sub-pixel. Then, an anode is formed by using a patterning process on the base substrate on which the above structure is formed. The anode of each sub-pixel is connected with the drain electrode of the drive transistor through the via in the planarization layer. After that, a pixel definition layer is formed through a patterning process on the base substrate on which the above structure is formed. A pixel opening exposing the anode is formed in the pixel definition layer of each sub-pixel. Each pixel opening is used as a light emitting region of each sub-pixel. Then, a hole injection layer and a hole transport layer are evaporated subsequently by using an open mask on the base substrate on which the above structure is formed, and a common connected layer of the hole injection layer and the hole transport layer is formed on the display substrate, that is, the hole injection layers of all sub-pixels are connected, and the hole transport layers of all sub-pixels are connected. For example, the respective areas of the hole injection layer and the hole transport layer are approximately the same and the thicknesses are different. After that, an electronic block layer and a red emitting layer, an electronic block layer and a green emitting layer, and an electronic block layer and a blue emitting layer are respectively evaporated on different sub-pixels by using a fine metal mask. The electronic block layers and the emitting layers of adjacent sub-pixels may overlap slightly (for example, the overlap part accounts for less than 10% of the area of the respective emitting layer pattern), or may be isolated. Then, a hole block layer, an electron transport layer, an electron injection layer and a cathode are evaporated subsequently by using an open mask, and a common connected layer of the hole block layer, the electron transport layer, the electron injection layer and the cathode is formed on the display substrate, that is, the hole block layers of all sub-pixels are connected, the electron transport layers of all sub-pixels are connected, the electron injection layers of all sub-pixels are connected, and the cathodes of all sub-pixels are connected.

In some exemplary embodiments, in a process of forming the first emitting layer, the first host material and the first dopant material may be evaporated together through a multi-source evaporation process, so that the first host material and the first dopant material are evenly dispersed in the first emitting layer. The mixing ratio and doping ratio may be adjusted and controlled by controlling the evaporation rate of the first host material or the first dopant material in the evaporation process. In a process of forming the second emitting layer, the second host material and the second dopant material may be evaporated together through a multi-source evaporation process, so that the second host material and the second dopant material are evenly dispersed in the second emitting layer. The mixing ratio and doping ratio may be adjusted and controlled by controlling the evaporation rate of the second host material or the second dopant material in the evaporation process.

In some exemplary embodiments, an orthographic projection of one or more of the hole injection layers, the hole transport layers, the hole block layers, the electron transport layers, the electron injection layers and the cathodes on the base substrate is continuous. In some examples, at least one of the hole injection layers, the hole transport layers, the hole block layers, the electron transport layers, the electron injection layers and the cathodes in at least one row or column of sub-pixels is connected. In some examples, at least one of the hole injection layers, the hole transport layers, the hole block layers, the electron transport layers, the electron injection layers and the cathodes of a plurality of sub-pixels are connected.

In some exemplary embodiments, the organic emitting layer may include a microcavity adjustment layer located between the hole transport layer and the emitting layer. For example, after the hole transport layer is formed, a red microcavity adjustment layer and a red emitting layer, a green microcavity adjustment layer and a green emitting layer, and a blue microcavity adjustment layer and a blue emitting layer may be respectively evaporated on different sub-pixels by using a fine metal mask. In some exemplary embodiments, the red microcavity adjustment layer, the green microcavity adjustment layer and the blue microcavity adjustment layer may include an electron block layer.

In some exemplary embodiments, since the hole block layers are common connected layers and the emitting layers of different sub-pixels are isolated, the orthographic projection of the hole block layer on the substrate includes the orthographic projection of the emitting layer on the substrate, and the area of the hole block layer is greater than the area of the emitting layer. In some examples, since the hole block layers are common connected layers, the orthographic projection of the hole block layer on the substrate at least includes the orthographic projections of the light emitting regions of two sub-pixels on the substrate.

In some exemplary embodiments, there is an overlap region between the orthographic projections of the emitting layers of at least partial sub-pixels on the substrate and the orthographic projection of the pixel drive circuit on the substrate.

By setting the first emitting layer and the second emitting layer, setting the energy level relationship between the electron block layer, the first emitting layer and the second emitting layer, and combining the thickness difference design of the first emitting layer and the second emitting layer, this exemplary embodiment optimizes the two interfaces on the two sides of the emitting layer, thus reducing the hole accumulation caused by the energy level gap, and reducing the electron accumulation at the interface between the emitting layer and the electron block layer. The hole concentration in the emitting layer may be appropriately increased and the electron concentration in the emitting layer may be appropriately reduced, so that the exciton recombination region moves towards the center of the emitting layer, and the exciton recombination region is far away from the electron block layer, thus reducing the damage to the electron block layer. In this way, the damage to the electron block layer is reduced while reducing the charge accumulation on the interface, thus improving the material stability of the electron block layer, reducing the material deterioration and performance degradation caused by electron accumulation, improving the service life of the device and improving the luminous efficiency.

Figure 9:
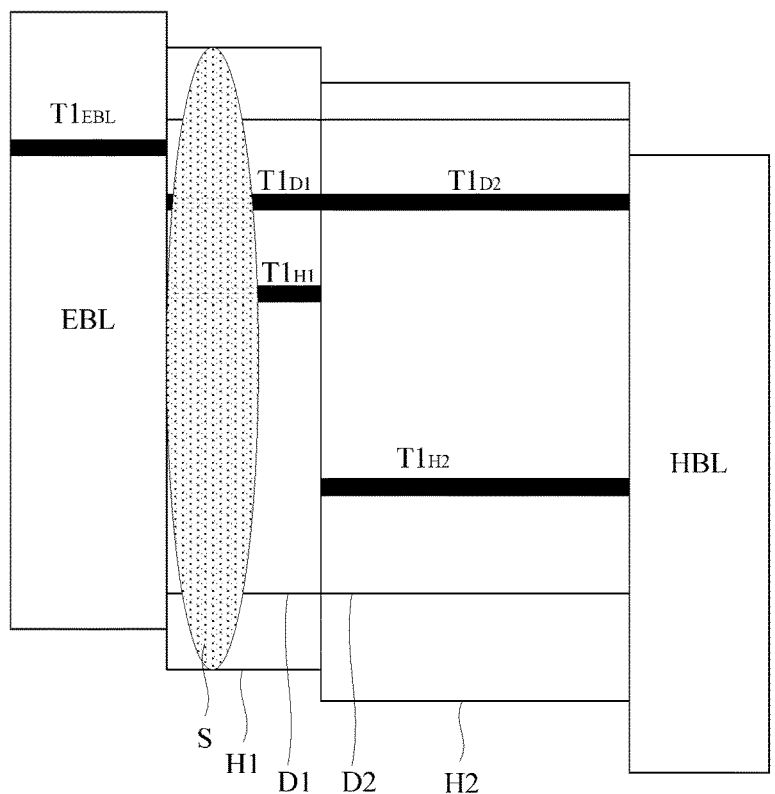
FIG. 9 illustrates a schematic diagram of another energy level relationship of an OLED according to at least one embodiment of the present disclosure.

FIG. 9 illustrates a schematic diagram of another energy level relationship of an OLED according to at least one embodiment of the present disclosure. In this exemplary embodiment, the first host material is different from the second host material, and the first dopant material may be the same as the second dopant material. Referring to FIG. 9, the lowest triplet energy level $T1_{EBL}$ of the electron block layer EBL is higher than the lowest triplet energy level $T1_{H1}$ of the first host material H1 of the first emitting layer, the lowest triplet energy level $T1_{H1}$ of the first host material H1 is higher than the lowest triplet energy level $T1_{H2}$ of the second host material H2 of the second emitting layer, the lowest triplet energy level $T1_{D1}$ of the first dopant material D1 is equal to the lowest triplet energy level $T1_{D2}$ of the second dopant material D2, which are higher than the lowest triplet energy level $T1_{H1}$ of the first host material H1, and the lowest triplet energy level $T1_{EBL}$ of the electron block layer EBL is higher than the lowest triplet energy level $T1_{D1}$ of the first dopant material D1.

In some exemplary embodiments, the electron block layer, the first emitting layer and the second emitting layer further satisfy:

$|T1_{EBL} - T1_{H1}| \geq 0.1$ eV, $|T1_{D1} - T1_{H1}| \geq 0.1$ eV, $|T1_{D2}-T1_{H1}| \geq 0.1$ eV, $|T1_{H1}-T1_{H2}| \geq 0.3$ eV, In this exemplary embodiment, when electrons and holes are recombined at the interface of the first emitting layer close to the electron block layer, due to the lowest triplet energy level relationship between the electron block layer, the first host material and the dopant material, the triplet excitons generated by electron and hole recombination will not be transferred to the electron block layer and the dopant material. Since the lowest triplet energy level of the first host material is higher than the lowest triplet energy level of the second host material, the triplet excitons are likely to be transferred to the lowest triplet energy level of the second host through Dexter energy transfer, and then transformed into singlet excitons through the TTA effect and transferred to the dopant material, and then returned to the ground state through radiation transition.

In this exemplary embodiment, the exciton recombination region and TTA effect occurrence region of the device can be separated by setting the lowest triplet energy level relationship among the electron block layer, the first host material, the second host material and the dopant material. Referring to FIG. 9, the exciton recombination region S is located in the first emitting layer and the TTA effect occurrence region is located in the second emitting layer, so that triplet exciton quenching caused by excitons can be avoided, thus improving the luminous efficiency and service life of the device.

In some exemplary embodiments, the electron block layer, the first emitting layer and the second emitting layer further satisfy:

$|HOMO_{EBL}-HOMO_{H1}| < 0.2$ eV, $|HOMO_{H1}-HOMO_{H2}| < 0.2$ eV, where $HOMO_{H1}$ is the HOMO energy level of the first host material of the first emitting layer, and $HOMO_{H2}$ is the HOMO energy level of the second host material of the second emitting layer.

In this exemplary embodiment, the HOMO energy levels of the first dopant material and the second dopant material are not limited. By setting the HOMO energy level relationship among the electron block layer, the first host material and the second host material, the hole transfer efficiency can be improved, thus improving the luminous efficiency of the device.

In some exemplary embodiments, the hole mobility of the first host material is greater than 100 times of the electron mobility thereof, and the electron mobility of the second host material is greater than 100 times of the hole mobility thereof. In this exemplary embodiment, by setting the mobility relationship between the first host material and the second host material, the exciton recombination region can be separated from the TTA region, thus avoiding triplet exciton quenching caused by the excitons, and improving the luminous efficiency and service life of the device.

In some exemplary embodiments, the thickness of the first emitting layer is about 0.1 nm to 10 nm. The thickness of the second emitting layer is not limited in this exemplary embodiment. In this exemplary embodiment, by setting the thickness of the first emitting layer, it can ensure sufficient Dexter energy transfer between the first emitting layer and the second emitting layer.

In some exemplary embodiments, both the first emitting layer and the second emitting layer may be blue emitting layers. The first host material and the second host material may be respectively ADN and its derivatives, and the doped first dopant material and second dopant material may be a blue fluorescent material. However, this present embodiment is not limited thereto.

Figure 10A:
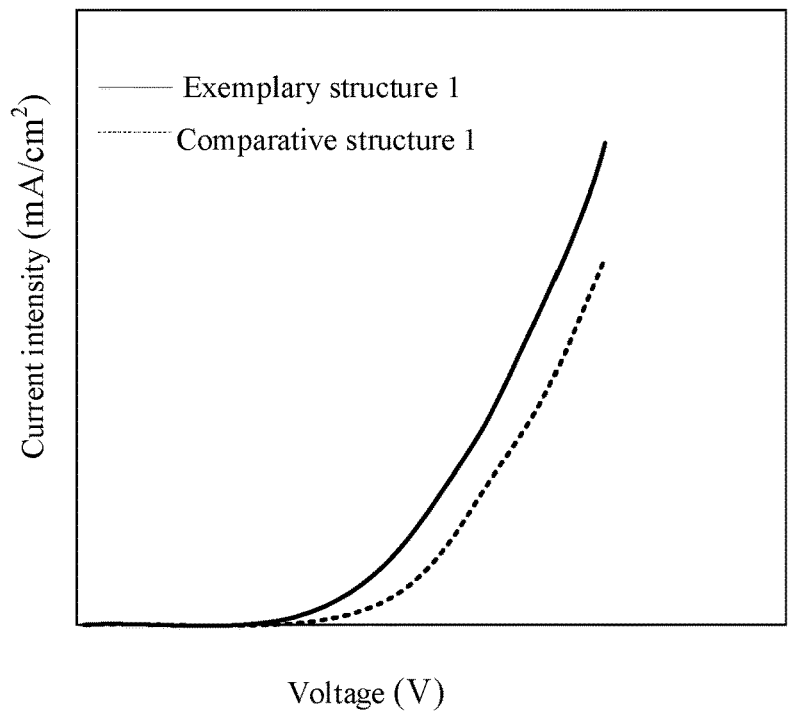
FIG. 10A to FIG. 10C illustrate schematic diagrams of performance comparison between a comparative structure 1 and an exemplary structure 1.
Figure 10B:
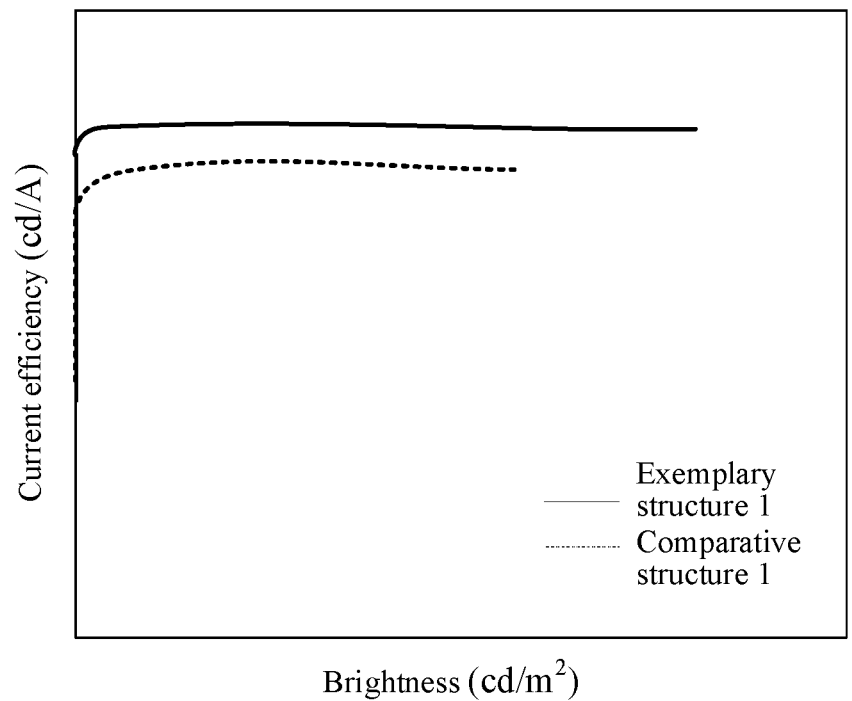
Figure 10C:
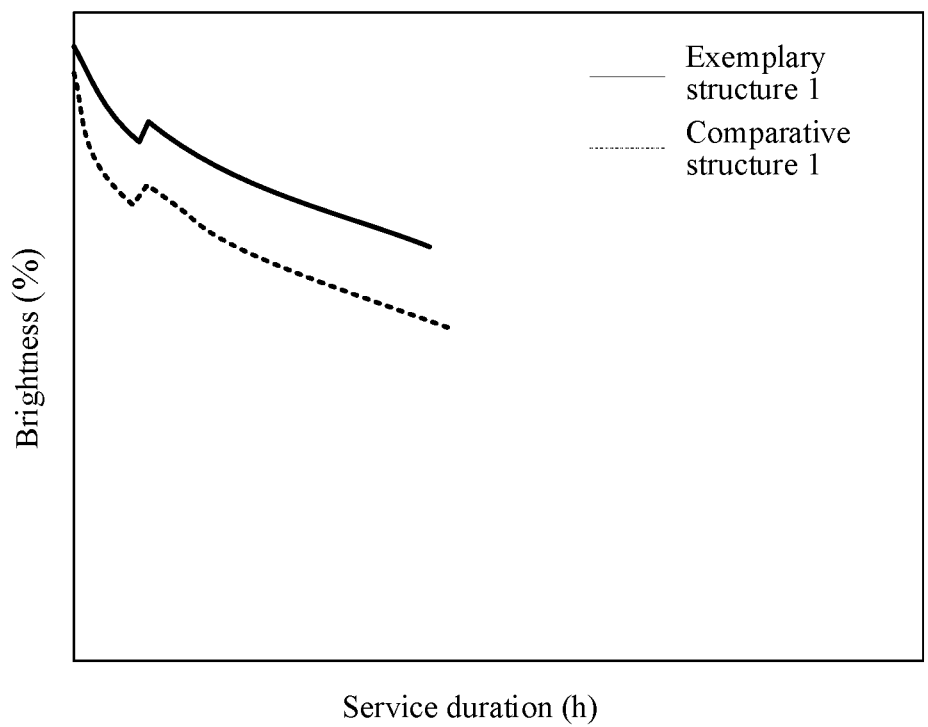

FIG. 10A to FIG. 10C illustrate schematic diagrams of performance comparison between a comparative structure 1 and an exemplary structure 1. FIG. 10A is a comparison diagram of on voltages of the comparative structure 1 and the exemplary structure 1. In FIG. 10A, the transverse coordinate represents the on voltage, and the on voltage marked by the transverse coordinate gradually increases along the extension direction of the transverse coordinate from left to right; the longitudinal coordinate represents the current intensity, and the current intensity marked by the longitudinal coordinate gradually increases along the extension direction of the longitudinal coordinate from bottom to top. FIG. 10B is a comparison diagram of the efficiencies of the comparative structure 1 and the exemplary structure 1. In FIG. 10B, the transverse coordinate represents the brightness, and the brightness marked by the transverse coordinate gradually increases along the extension direction of the transverse coordinate from left to right; the longitudinal coordinate represents the current efficiency, and the current efficiency marked by the longitudinal coordinate gradually increases along the extension direction of the ordinate from bottom to top. FIG. 10C is a comparison diagram of the service lives of the comparative structure 1 and the exemplary structure 1. In FIG. 10C, the transverse coordinate represents the service duration, and the service duration marked by the transverse coordinate gradually increases along the extension direction of the transverse coordinate from left to right; the longitudinal coordinate represents the brightness, and the brightness marked by the longitudinal coordinate gradually increases along the extension direction of the longitudinal coordinate from bottom to top. Table 1 shows the performance comparison result of the exemplary structure 1 and the comparative structure 1 according to at least one embodiment of the present disclosure. In the comparative experiment, both the comparative structure 1 and the exemplary structure 1 are top emission type devices, the structure of the organic emitting layer of the comparative structure 1 is HIL/HTL/EBL/EML/HBL/ETL/EIL, and the structure of the organic emitting layer of the exemplary structure 1 is HIL/HTL/EBL/EML1/EML2/HBL/ETL/EIL. The thickness of the corresponding film layers of the comparative structure 1 and the exemplary structure 1 is the same, and the materials of the hole injection layers HIL, the hole transport layers HTL, the electron block layers EBL, the hole block layers HBL, the electron transport layers ETL and the electron injection layers EIL of the comparative structure 1 and the exemplary structure 1 are respectively the same. In the comparative experiment, the material of the emitting layer EML of the comparative structure 1 is the same as the material of the second emitting layer EML2 of the exemplary structure 1. EBL, EML1 and EML2 in the exemplary structure 1 satisfy the energy level relationship illustrated in FIG. 9.

For example, the energy levels of the first host materials and the second host materials used in the comparative structure 1 and the exemplary structure 1 are as follows:

|  | HOMO energy level | LUMO energy level | Lowest triplet energy level |
|---|---|---|---|
| First host material | −5.8 eV | −2.6 eV |  |
| Second host material | −5.9 eV | −2.8 eV | 1.7 |

The first host material and the second host material may be materials matched according to the above energy level relationship, which are not limited in this embodiment. The first dopant material of the first emitting layer and the second dopant material of the second emitting layer may be the same, the doping ratio of the first dopant material in the first emitting layer may be about 1%, and the doping ratio of the second dopant material in the second emitting layer may be about 1%. The thickness of the emitting layer of the comparative structure 1 may be about 200 angstroms, the thickness of the first emitting layer of the exemplary structure 1 may be about 50 angstroms, and the thickness of the second emitting layer may be about 150 angstroms.

TABLE 1

Performance comparison result of comparative structure 1 and exemplary structure 1

|  | Voltage | Efficiency | Service life |
| --- | --- | --- | --- |
| Comparative structure 1 | 100% | 100% | 100% |
| Exemplary structure 1 | 96% | 107% | 160% |

Referring to FIG. 10A to FIG. 10C and Table 1, compared with the comparative structure 1, the on voltage of the exemplary structure 1 is reduced by 4%, the efficiency is increased by 7%, and the service life is increased by 60%. It can be seen that the efficiency and service life of the device are significantly improved. Therefore, in this exemplary embodiment, by adopting a double-layer emitting layer structure, and combining the lowest triplet energy level of the electron block layer, the first emitting layer and the second emitting layer, or combining the lowest triplet energy level and the HOMO energy level, or combining the lowest triplet energy level, the HOMO energy level and the mobility relationship, the exciton recombination region and the TTA effect occurrence region can be separated, and the service life and efficiency of the device are significantly improved.

An embodiment of the present disclosure further provides a display apparatus, which includes the organic light emitting device. The display apparatus may be any product or component with a display function, such as mobile phone, tablet computer, TV, display, notebook computer, digital photo frame, navigator, vehicle-mounted display, smart watch or smart bracelet.

Although the embodiments disclosed in the present disclosure are as above, the content described thereof is only for the convenience of understanding the present disclosure and is not used to limit the present disclosure. Those skilled in the art may make any modification and change in the forms and details of the implementations without departing from the essence and scope of the present disclosure. However, the scope of protection of the present disclosure should still be subject to the scope defined by the attached claims.

What is claimed is:

1. An organic light emitting device, comprising: a first electrode, a second electrode, and a first emitting layer and a second emitting layer that are disposed between the first electrode and the second electrode, wherein the first emitting layer is located on a side of the second emitting layer close to the first electrode; and an electron block layer is disposed between the first emitting layer and the first electrode;
the first emitting layer comprises a first host material and a first dopant material, the second emitting layer comprises a second host material and a second dopant material, and the first host material is different from the second host material;
the electron block layer, the first emitting layer and the second emitting layer satisfy:

$|HOMO_{EBL}| < |HOMO_{EML1}| < |HOMO_{EML2}|$, $|HOMO_{EML1} - HOMO_{EBL}| = 0.2$ eV to $0.4$ eV, where $HOMO_{EBL}$ is a Highest Occupied Molecular Orbit (HOMO) energy level of the electron block layer, $HOMO_{EML1}$ is a HOMO energy level of the first emitting layer, and $HOMO_{EML2}$ is a HOMO energy level of the second emitting layer;
and, the electron block layer, the first emitting layer and the second emitting layer satisfy:

$T1_{EBL} > T1_{H1} > T1_{H2}$, $T1_{D1} > T1_{H1}$, $T1_{D2} > T1_{H1}$, $T1_{D1} = T1_{D2}$, $T1_{EBL} > T1_{D1}$, where $T1_{EBL}$ is a lowest triplet energy level of the electron block layer, $T1_{H1}$ is a lowest triplet energy level of the first host material of the first emitting layer, $T1_{H2}$ is a lowest triplet energy level of the second host material of the second emitting layer, and $T1_{D1}$ is a lowest triplet energy level of the first dopant material of the first emitting layer, and $T1_{D2}$ is a lowest triplet energy level of the second dopant material of the second emitting layer;
wherein an exciton recombination region is located in the first emitting layer and a Triplet-Triplet Annihilation (TTA) effect occurrence region is located in the second emitting layer;
wherein both the first emitting layer and the second emitting layer are blue emitting layers;
the first dopant material and the second dopant material are blue fluorescent materials;
a ratio of a thickness of the first emitting layer to that of the second emitting layer is about 0.1 to 0.6.

2. The organic light emitting device according to claim 1, wherein a hole mobility of the first emitting layer is greater than an electron mobility of the first emitting layer, and an electron mobility of the second emitting layer is greater than a hole mobility of the second emitting layer.

3. The organic light emitting device according to claim 1, wherein the HOMO energy level of the electron block layer is about −5.4 eV to −5.6 eV, the HOMO energy level of the first emitting layer is about −5.6 eV to −5.8 eV, and the HOMO energy level of the second emitting layer is about −5.8 eV to −6.0 eV.

4. The organic light emitting device according to claim 1, wherein the thickness of the first emitting layer is about 3 nm to 8 nm, and the thickness of the second emitting layer is about 15 nm to 20 nm.

5. The organic light emitting device according to claim 1, wherein the electron block layer, the first emitting layer and the second emitting layer further satisfy:

$T1_{EBL} - T1_{H1}| \geq 0.1$ eV, $T1_{D1} - T1_{H1}| \geq 0.1$ eV, $T1_{D2} - T1_{H1} \geq 0.1$ eV, $T1_{H1} - T1_{H2} \geq 0.3$ eV.

6. The organic light emitting device according to claim 1, wherein the electron block layer, the first emitting layer and the second emitting layer further satisfy:

$|HOMO_{EBL} - HOMO_{H1}| < 0.2$ eV, $|HOMO_{H1} - HOMO_{H2}| < 0.2$ eV, where $HOMO_{H1}$ is a HOMO energy level of the first host material of the first emitting layer, and $HOMO_{H2}$ is a HOMO energy level of the second host material of the second emitting layer.

7. The organic light emitting device according to claim 6, wherein the first host material is a hole-rich material, and the second host material is an electron-rich material.

8. The organic light emitting device according to claim 1, wherein a thickness of the first emitting layer is about 0.1 nm to 10 nm.

9. The organic light emitting device according to claim 1, wherein a doping ratio of the first dopant material in the first emitting layer is the same as that of the second dopant material in the second emitting layer.

10. The organic light emitting device according to claim 1, wherein a doping ratio of the first dopant material in the first emitting layer is about 0.1% to 30%, and a doping ratio of the second dopant material in the second emitting layer is about 0.1% to 30%.

11. The organic light emitting device according to claim 1, wherein materials of the first emitting layer and the second emitting layer respectively comprise at least one of the following: pyrene derivatives, anthracene derivatives, fluorene derivatives, perylene derivatives, styrylamine derivatives and metal complexes.

12. The organic light emitting device according to claim 1, wherein a material of the electron block layer comprises a triphenylamine organic material.

13. A display apparatus, comprising the organic light emitting device according to claim 1.

14. The organic light emitting device according to claim 7, wherein a hole mobility of the first host material is greater than 100 times of an electron mobility of the first host material; and an electron mobility of the second host material is greater than 100 times of a hole mobility of the second host material.

15. The organic light emitting device according to claim 5, wherein the electron block layer, the first emitting layer and the second emitting layer further satisfy:

$|HOMO_{EBL} - HOMO_{H1}| < 0.2$ eV, $|HOMO_{H1} - HOMO_{H2}| < 0.2$ eV, where $HOMO_{H1}$ is a HOMO energy level of the first host material of the first emitting layer, and $HOMO_{H2}$ is a HOMO energy level of the second host material of the second emitting layer.

16. The organic light emitting device according to claim 5, wherein a thickness of the first emitting layer is about 0.1 nm to 10 nm.

* * * * *